US012256193B1

(12) United States Patent
Visser et al.

(10) Patent No.: US 12,256,193 B1
(45) Date of Patent: Mar. 18, 2025

(54) JIG FOR ASSEMBLY OF SEGMENTS INTO A RING GEOMETRY

(71) Applicant: The United States of America as represented by the Secretary of the Navy, Newport, RI (US)

(72) Inventors: William A Visser, West Warwick, RI (US); Ian M Doyle, Newport, RI (US); David C Ponte, Exeter, RI (US)

(73) Assignee: The United States of America as represented by the Secretary of the Navy

( * ) Notice: Subject to any disclaimer, the term of this patent is extended or adjusted under 35 U.S.C. 154(b) by 420 days.

(21) Appl. No.: 17/969,744

(22) Filed: Oct. 20, 2022

(51) Int. Cl.
| *B32B 41/00* | (2006.01) |
| *H04R 17/00* | (2006.01) |
| *H10N 30/073* | (2023.01) |
| *B06B 1/06* | (2006.01) |

(52) U.S. Cl.
CPC ........... *H04R 17/00* (2013.01); *H10N 30/073* (2023.02); *B06B 1/0633* (2013.01); *H04R 2217/01* (2013.01)

(58) Field of Classification Search
CPC .. H04R 17/00; H04R 2217/01; H10N 30/073; B06B 1/0633
USPC ..................... 156/60, 64, 350, 351, 378, 379
See application file for complete search history.

(56) References Cited

U.S. PATENT DOCUMENTS

2016/0032743 A1\* 2/2016 Duchaine ................ B29C 65/48
156/60

OTHER PUBLICATIONS

Incra, Segmented Ring Jig, Incra Build It System, https://incra.com/info/segmented_ring_jig_08.pdf (Year: 2007).\*
Al Weinzapfel, "Make a Tourniquet to Clamp Segmented Rings", FineWoodworking, https://www.finewoodworking.com/2018/06/07/make-tourniquet-clamp-segmented-rings?srsltid=AfmBOooI6XFOqwXFhPZrRfehB9rXDgD36nuiWpELek18607A67-oYjdc (Year: 2018).\*
https://www.finewoodworking.com/2018/06/07/make-tourniquet-clamp-segmented-rings?srsltid=AfmBOooI6XFOqwXFhPZrRfehB9rXDgD36nuiWpELek18607A67-oYjdc (Year: 2018).\*
https://incra.com/info/segmented_ring_jig_08.pdf (Year: 2007).\*

\* cited by examiner

*Primary Examiner* — Michael N Orlando
*Assistant Examiner* — Joshel Rivera
(74) *Attorney, Agent, or Firm* — James M. Kasischke; Michael P. Stanley; Jeffry C. Severson (57) ABSTRACT

A jig for assembly of a segmented ring comprises an inner hub, an outer housing, a base, and a top cap defining a ring-shaped channel therebetween. Springs disposed about a perimeter of the inner hub face the outer housing within the ring-shaped channel. Through holes in the outer housing receive dowels projecting radially into the ring-shaped channel to pair respectively with the springs. Nocks in all dowels receive an adjustment string that applies uniform radial force to objects pinched between the dowels and springs within the channel. A tensioner peg mounted to the base secures the adjustment string while under tension. The inner hub, outer housing, base, and/or top cap may be constructed of aluminum coated with a nonsticking polymer to prevent sticking to adhesive that cures in the ring-shaped channel to create a finished segmented ring assembly.

20 Claims, 10 Drawing Sheets

FIG. 1

(PRIOR ART)

JIG FOR ASSEMBLY OF SEGMENTS INTO A RING GEOMETRY

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER APPLICATIONS

None.

BACKGROUND OF THE INVENTION

(1) Field of the Invention

The present invention generally relates to mechanical component assembly and, more specifically, to custom-made tools for constructing geometric segments into a ring.

(2) Description of the Related Art

Figure 1:
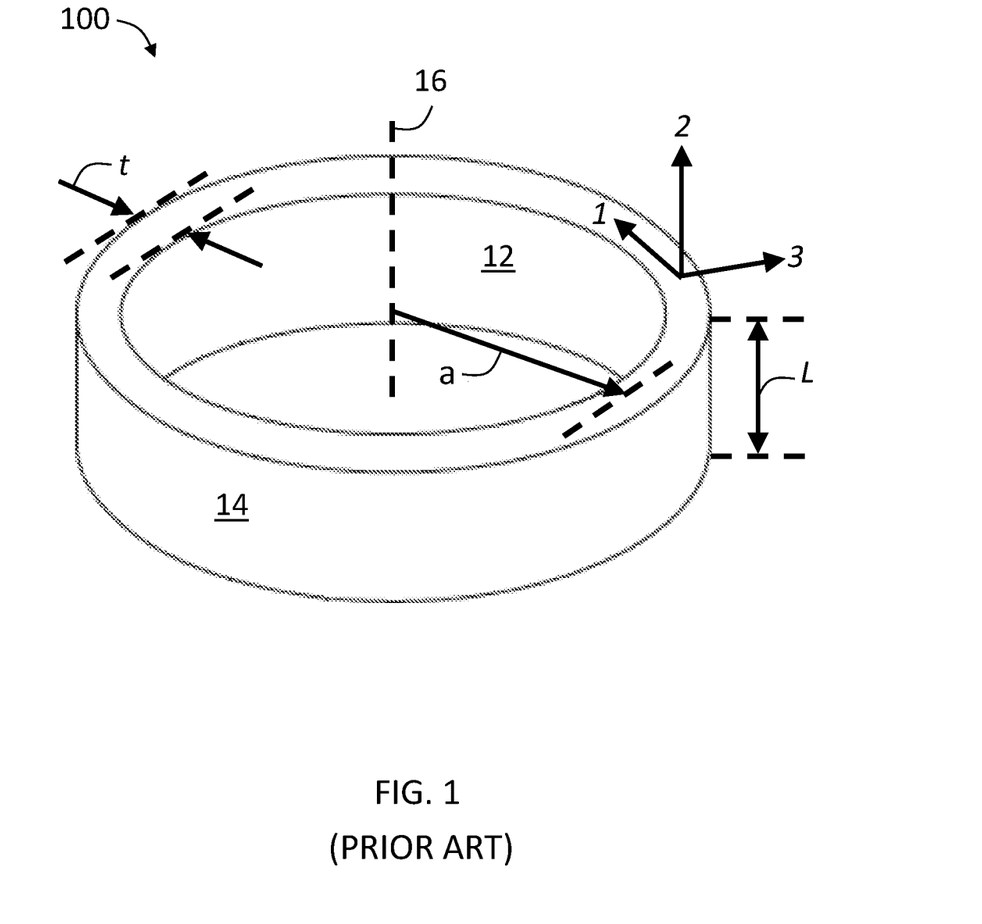
FIG. 1 depicts a top perspective view of a piezoelectric ring projector as known in the prior art.
Figure 2:
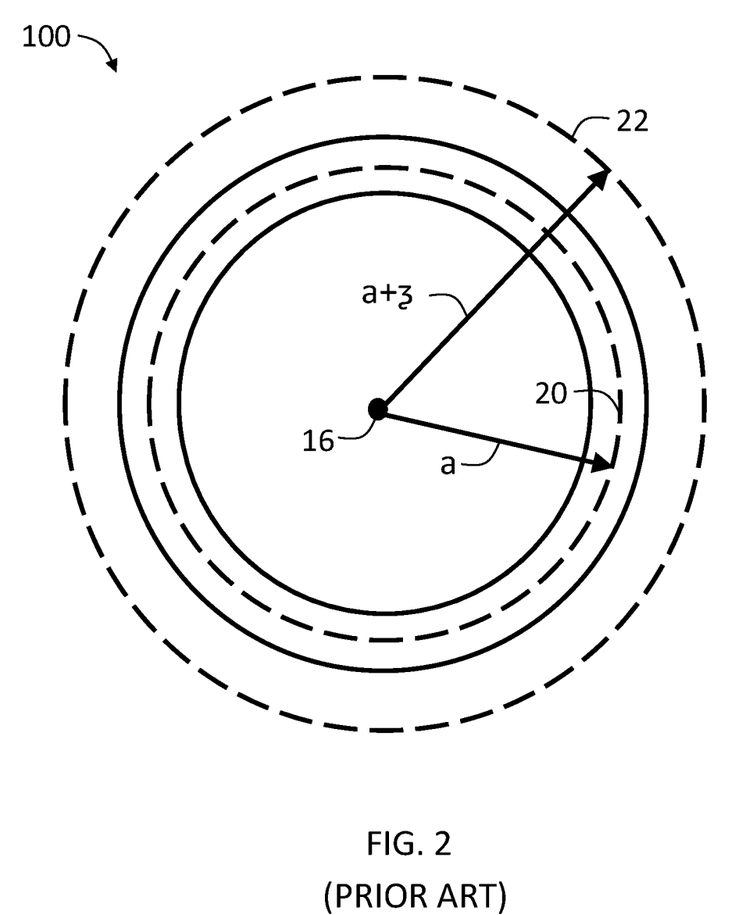
FIG. 2 depicts a top view of the piezoelectric ring projector of FIG. 1 in a radial vibrating state.

One of the most common forms of underwater acoustic transducers used in both projector and hydrophone applications is a ring (e.g., short, thin-walled cylinder) made of piezoelectric material. As illustrated in FIG. 1, a piezoelectric ring projector 100 of mean radius "a", thickness "t", and length "L" is commonly operated in the 31-mode. The 31-mode ring 100 has electrodes on the inner 12 and outer 14 cylindrical surface areas and the piezoelectric material is polarized in the circumferential direction (i.e., 1-direction substantially tangential to cylindrical ring 100). An electric field applied radially (i.e., 3-direction projecting radially outward from axis 16) over the electrodes 12, 14 produces circumferential strain (1-direction) in the piezoelectric material causing radial vibrations in the ring 100. As depicted in FIG. 2, ring 100 oscillates between mean radius 20 and 22 having radii "a" and "a+$\xi$", respectively. (In using piezoelectric materials, a convention is for the poled axis to be identified as the 3 axis.)

Figure 3:
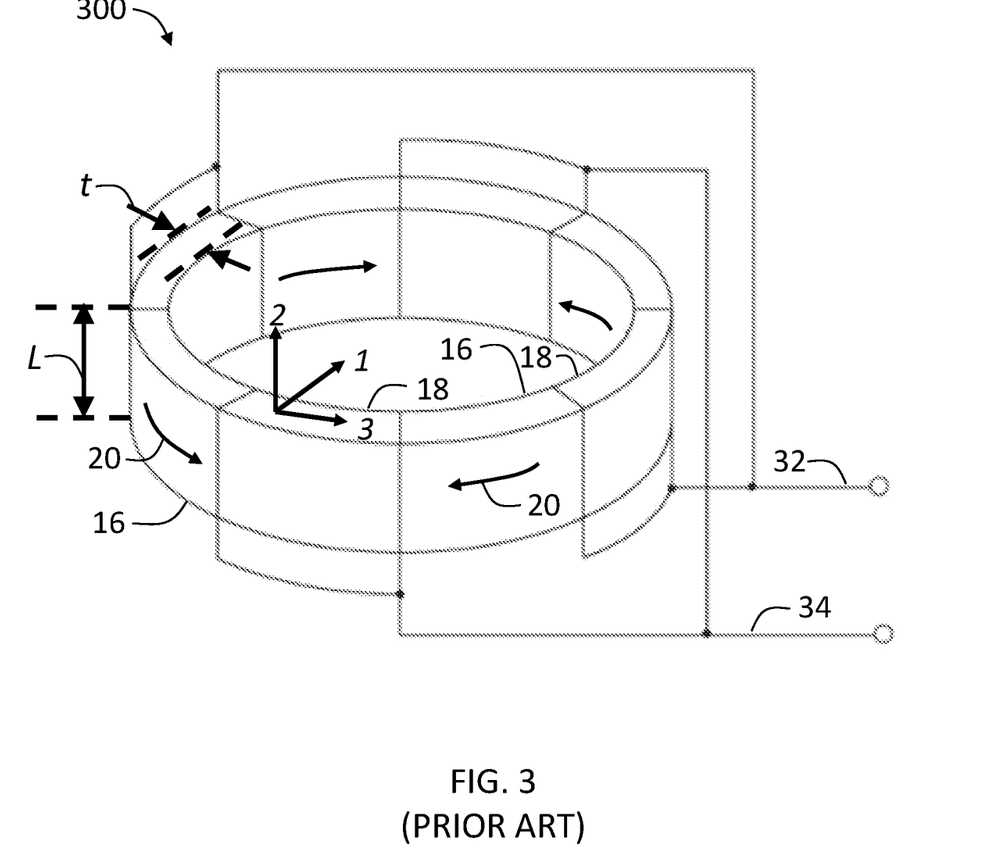
FIG. 3 depicts a top perspective view of a wired segmented piezoelectric ring transducer as known in the prior art.
Figure 4:
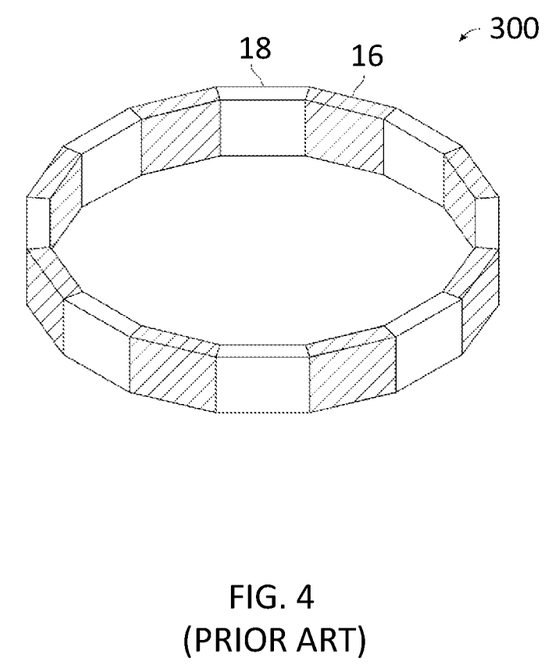
FIG. 4 depicts a top perspective view of a segmented ring with inactive segments interlaced with active piezoelectric segments as known in the prior art.

The performance of a piezoelectric ring transducer design can be enhanced with a segmented construction 300 as depicted in FIG. 3. Piezoelectric elements 16, 18 are cemented together in mechanical series with electrodes 32, 34 between them. Bars or staves of piezoelectric material can be operated in the 33-mode, which results in increased performance. The direction of applied electric field (3-direction) and strain (3-direction) in the piezoelectric material are both oriented along the circumference to produce cylindrical vibrations from the segmented ring 300. The segmented construction allows for addition of inactive or passive segments 18 interlaced with active segments 16 to modify the electroacoustic performance. The arrows 20 show the direction of polarization in the active segments 16. The schematic of FIG. 4 illustrates the segmented ring 300 with active segments 16 (denoted by shading) interlaced with inactive piezoelectric segments 18 (denoted as unshaded), and as assembled prior to introduction of parallel wiring to deliver current to operate the ring 300.

The electroacoustic performance characteristics that can be modified with segmented construction include, but are not limited to, resonance frequency, anti-resonance frequency, mechanical quality factor, effective electromechanical coupling coefficient, and electrical impedance. Although certain segmented ring transducer designs with all active segments or with combined active and passive segments, as well as their theoretical operations, are known in the field of underwater acoustic transducers, details associated with physically constructing such designs remains largely unstandardized (e.g., left to custom tooling and methods).

As such, a need exists for a device and associated method for assembling a segmented ring.

BRIEF SUMMARY OF THE INVENTION

Accordingly, it is therefore a primary object and general purpose of the present invention to guide assembly of a segmented ring using a reusable jig and associated methods of operation.

In a first embodiment, a jig for assembly of segments into a ring geometry include an inner hub surrounded by an outer housing and mounted to a base. The inner hub and outer housing are positioned to define a ring-shaped channel therebetween. Springs are disposed about a perimeter of the inner hub facing the outer housing within the ring-shaped channel. Through holes in the outer housing receive dowels, each of which projects radially into the ring-shaped channel to pair with a respective one of the springs (also referred to in combination as pinch pairings).

Each of the dowels includes a nock positioned outside of the outer housing and configured to receive an adjustment string. The adjustment string is passed through a hole in a tensioner peg mounted to the base and positioned in the dowel nocks surrounding the outer housing. After the adjustment string is secured to the tensioner pegs via an upper hex nut, the tensioner peg is rotated until a desired tension in the adjustment string is achieved (i.e., the adjustment string applies a compressive force to the dowels to displace the segments into a segmented ring geometry). After the desired tension in the adjustment string is achieved through rotating the tensioner peg, the tensioner peg is secured to the base of the jig using a lower hex nut. The upper and lower hex nuts are threadedly fastened at the tensioner peg to secure the adjustment string while under tension. A top cap mounts to the inner hub opposite the base and encloses the ring-shaped channel. The inner hub, outer housing, base, and top cap may be constructed of aluminum coated with a non-sticking polymer.

In a method aspect, segmented ring assembly steps include adding an adhesive to attaching surfaces of a set of segments; positioning each of the segments next to a respective spring within the ring-shaped channel; projecting each of the dowels into the through holes in the outer housing and pinching each of the segments between a respective dowel and spring pinch pairing; applying uniform compression to all dowels in all pinch pairings using the adjustment string; securing the adjustment string at the uniform tension using the tensioner peg and hex nuts; mounting the top cap to the inner hub opposite the base, thereby enclosing the ring-shaped channel and vertically positioning the segments; upon curing of the adhesive, retracting the dowels from the pinch pairings and extracting the finished segmented ring assembly from the ring-shaped channel.

These and other objects, features, and advantages of the present invention will become more readily apparent from the attached drawings and the detailed description of the invention.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein like reference numerals and symbols designate identical or corresponding parts throughout the several views and wherein.

DETAILED DESCRIPTION OF THE INVENTION

The assembly described herein is a jig device for physically assembling segmented components into a ring geometry. More specifically, the jig is used for joining and adhering material shaped as segments into a ring geometry. The jig is designed to assemble one segmented ring at a time in an advantageously efficient and repeatable manner.

Figure 5:
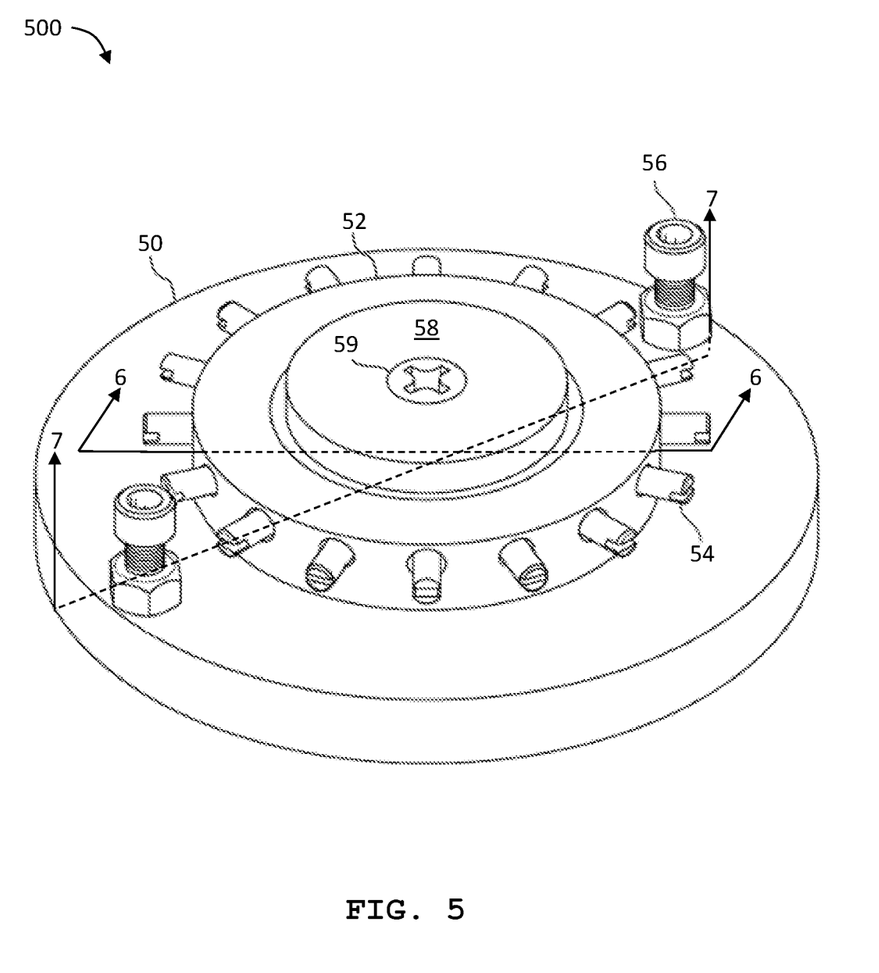
FIG. 5 depicts a top perspective view of a jig for assembly of segments into a ring geometry of the present invention.
Figure 6:
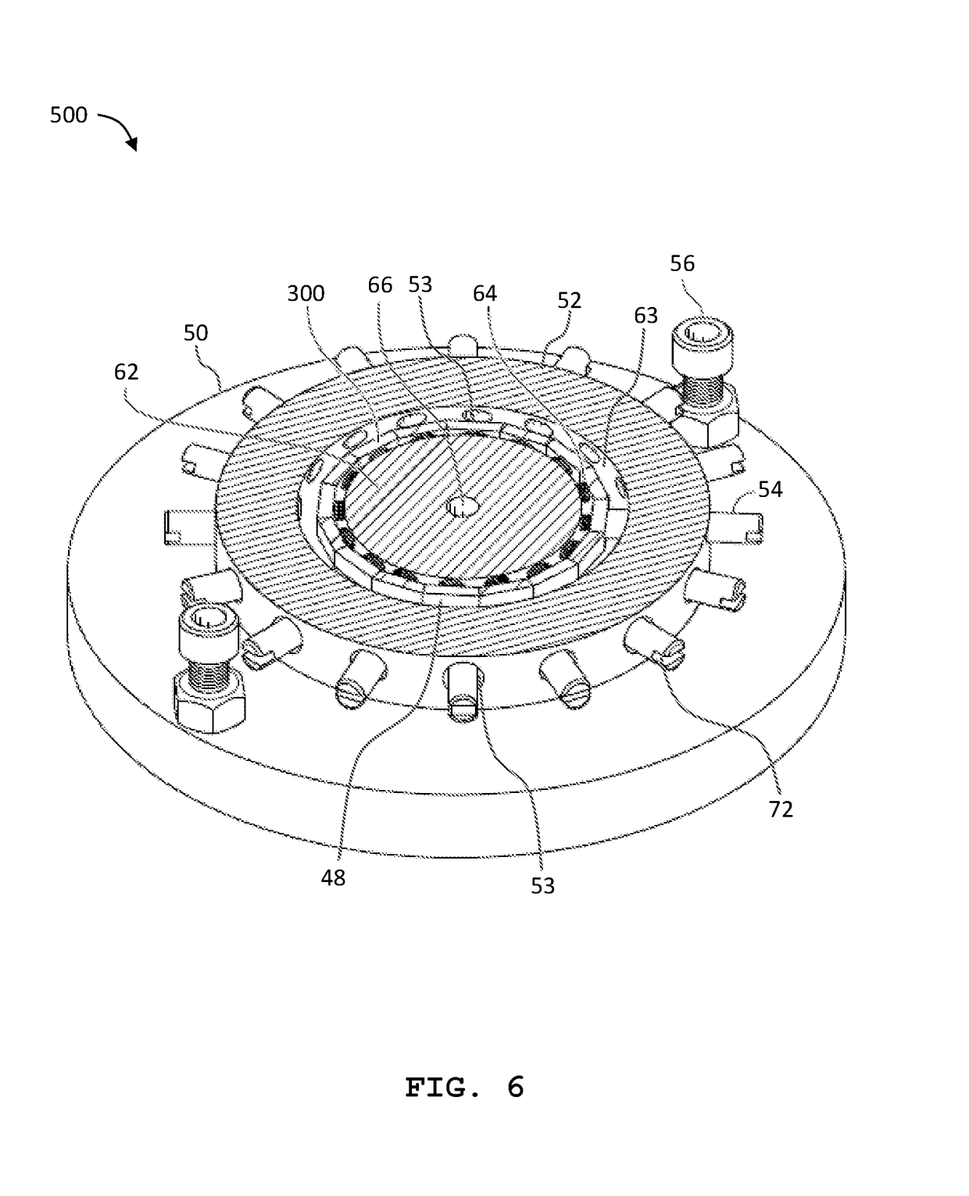
FIG. 6 depicts the segmented ring of FIG. 4 staged within a first cross-section view of the jig of FIG. 5 with the view taken along reference lines 6-6 of FIG. 5.

Referring initially to FIGS. 5 and 6, a jig 500 for assembly of segments 48 into a ring geometry comprises a base 50 upon which is mounted a substantially cylindrical inner hub 62 (see FIG. 6) surrounded by an outer housing 52. FIG. 5 shows a top cap 58 mounted on the top of inner hub 62. The inner hub 62 and outer housing 52 define a ring-shaped channel 63 therebetween and above the base 50. Substantially uniformly disposed about a perimeter of the inner hub 62 are anchoring mechanisms (e.g., cavities) each configured to receive and fixedly position a respective spring 64. Substantially uniformly disposed about a perimeter of the outer housing 52 are through holes 53. Each through hole 53 extends from a radially outer surface of outer housing 52 through to an inner surface of outer housing 52. Through holes 53 are sized to receive a set of dowels 54 such that each dowel 54 projects radially through one through hole 53 in outer housing 52.

Figure 7:
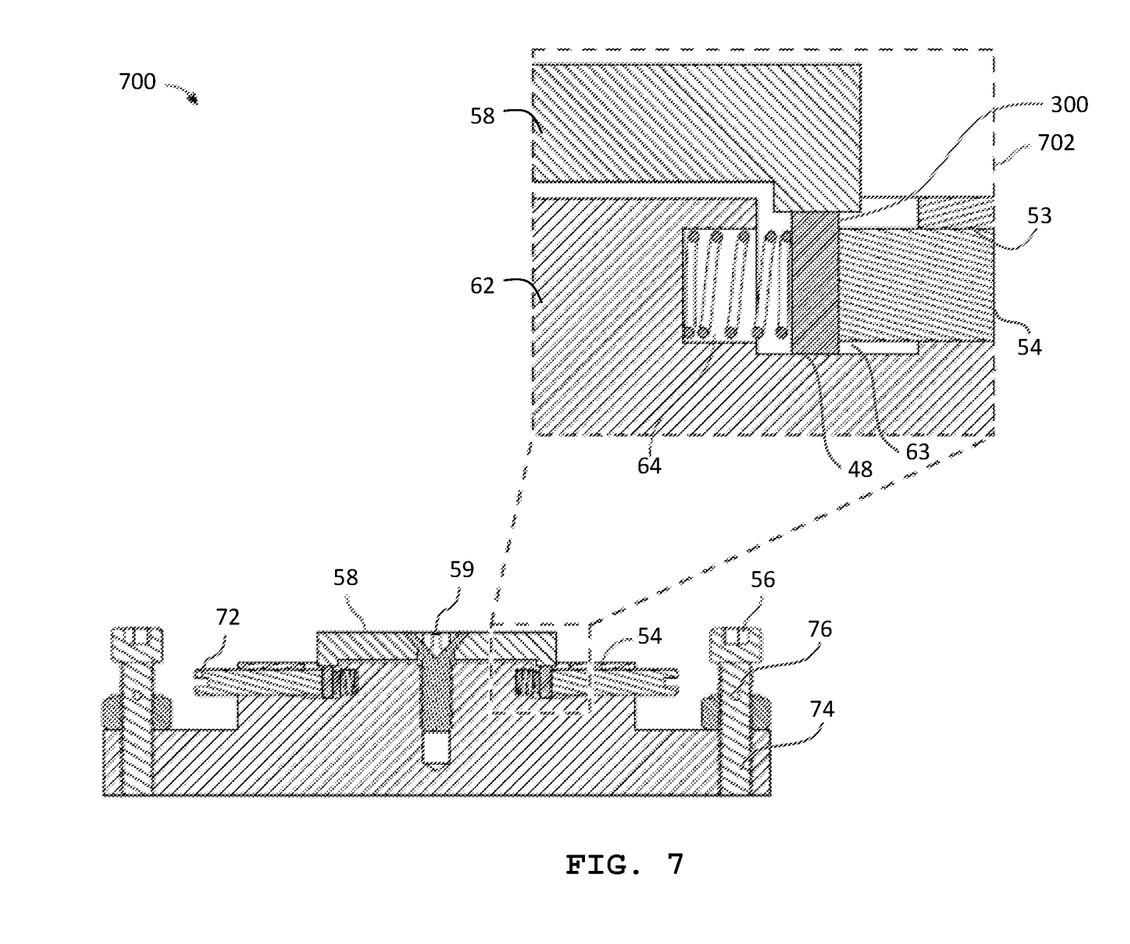
FIG. 7 depicts the segmented ring of FIG. 4 within a second cross-section and exploded view of the jig of FIG. 5 with the view taken along reference lines 7-7 of FIG. 5.
Figure 8:
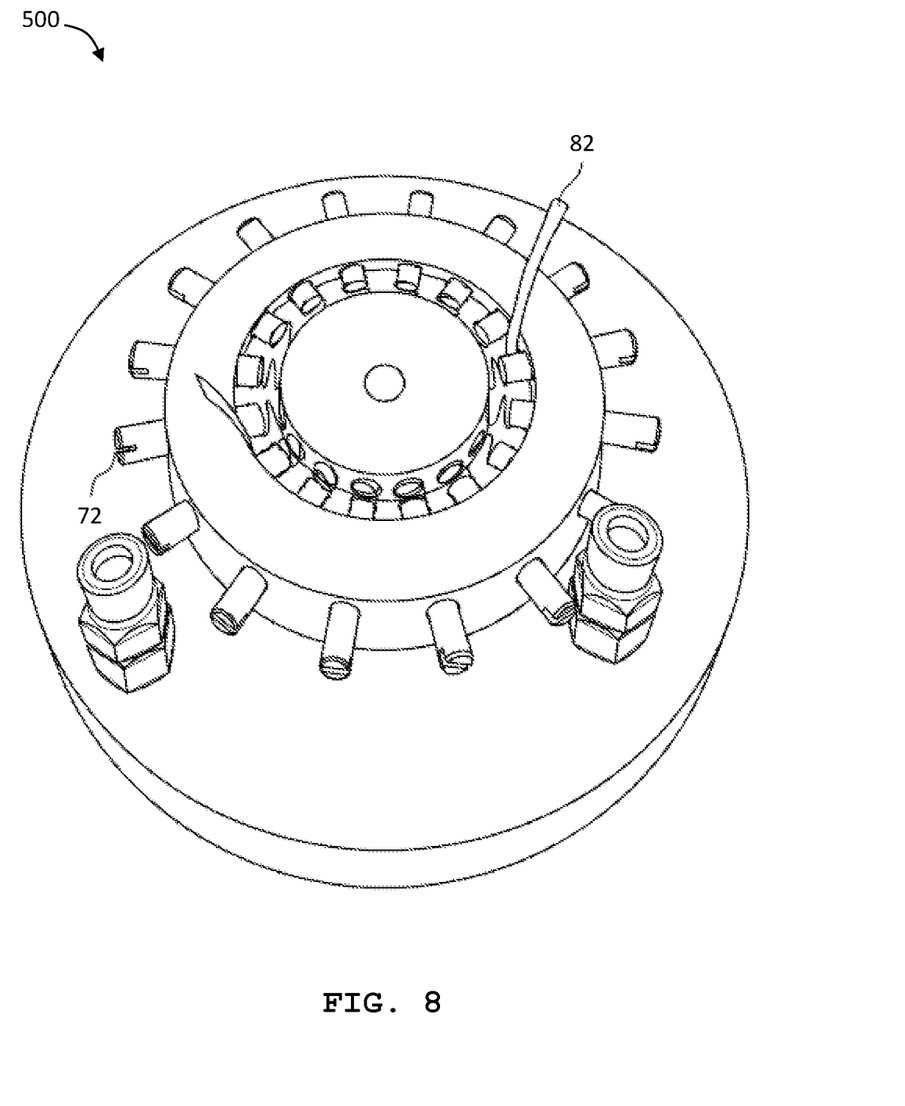
FIG. 8 depicts a top perspective view of a jig for assembly of segments into a ring geometry of the present invention in a first stage of loading with top cap removed.
Figure 9:
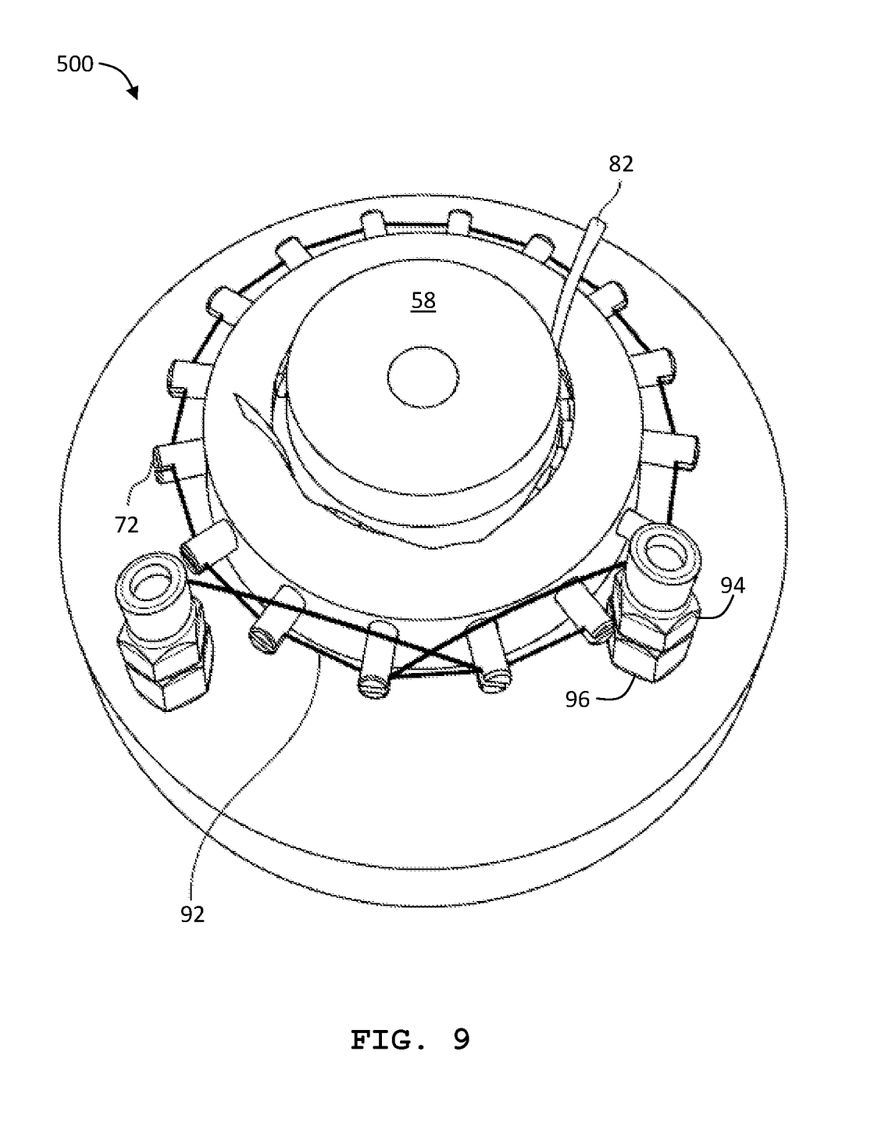
FIG. 9 depicts the jig of FIG. 8 in a second stage of loading with top cap and adjustment string applied.

As shown in detail view 702 of FIG. 7, each dowel 54 pairs with a respective one of the springs 64 within the ring-shaped channel 63. An object, such as a segment 48 of a segmented ring 300 shown in FIGS. 6 and 7, positioned in the ring-shaped channel in the path of a paired dowel 54 and spring 64 is pinched with a force transferred from an adjustment string 92 of FIG. 9. The adjustment string 92 can be secured at its end(s) to one or more tensioner pegs 56 mounted to the base 50. Each tensioner peg 56 comprises a threaded post 74 with a feed hole 76 transversely therethrough for receiving adjustment string 92. Referring additionally to FIGS. 8 and 9, each of the dowels 54 has a nock 72 configured to receive the adjustment string 92. Adjustment string 92 can be received in the dowel 54 nocks 72 and secured to tensioner pegs 56. Tightening the tensioner pegs 56 applies tension to the adjustment string 92 and uniformly forces the dowels 54 into respective through holes 53 toward opposing springs 64. The tension introduced in the adjustment string 92 by the tensioner pegs 56 causes the dowels 54 and opposing springs 64 to hold in place the segments 48 pinched in the ring-shaped channel 63.

A top cap 58 with a center screw 59 is mounted removably above the inner hub 62 as shown in FIG. 5 and FIG. 7. An axial bore 66 in the inner hub 62 threadedly receives the center screw 59, fixedly positioning the top cap 58 to enclose the ring-shaped channel 63 from above (i.e., opposite the base 50 as shown in FIG. 9).

Referring to FIGS. 8 and 9, the jig 500 is designed for cementing segments 48 into a ring geometry using an adhesive introduced between adjacent segments 48. To prevent undesired adhesion of the segments to jig surfaces (e.g., base 50, inner hub 62, outer housing 52, top cap 58), the jig 500 may comprise aluminum 6061 material coated with a polymer having non-sticking properties (e.g., Teflon® or the like).

Figure 10:
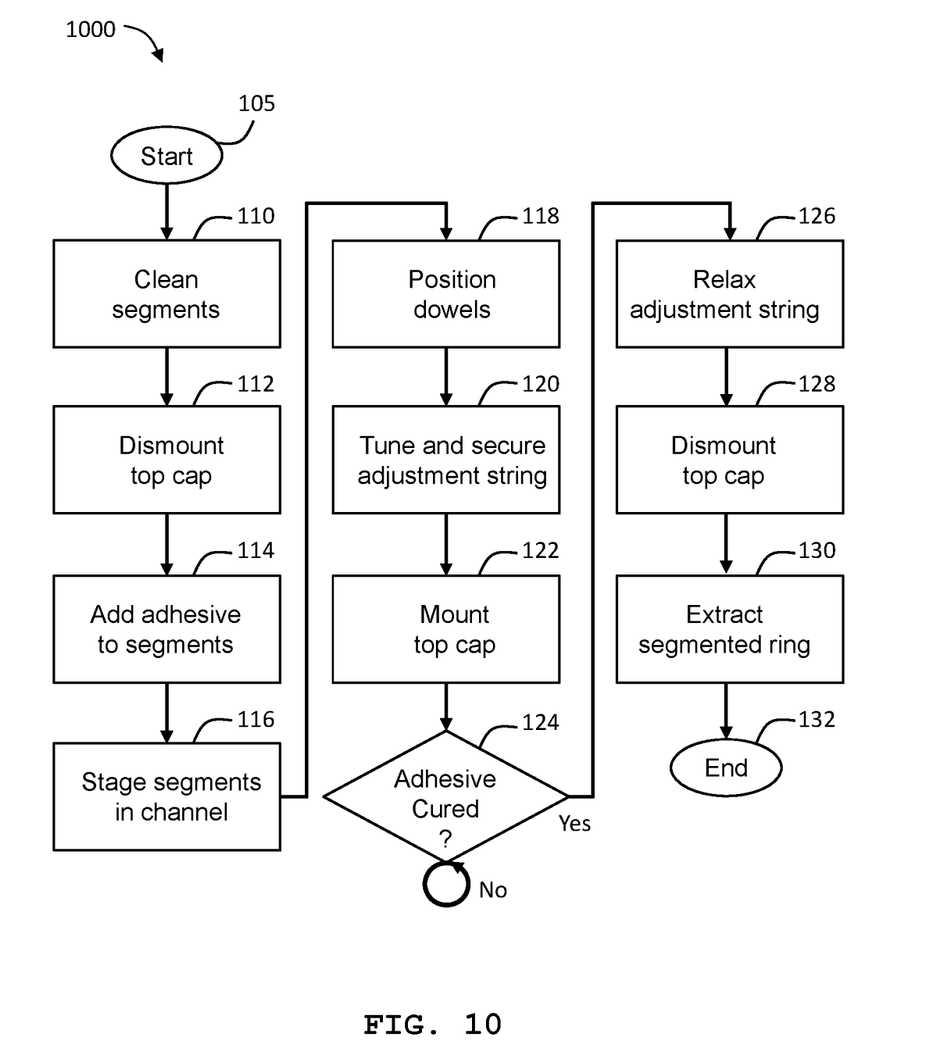
FIG. 10 depicts a flow chart of exemplary steps of a segmented ring assembly method of the present invention.

Referring now to FIG. 10, block diagram 1000 illustrates an operational sequence of the present invention. Starting at block 105, each of a set of segments 48 are cleaned and adhesive is applied to contact areas between segments 48 (block 110). The top cap 58 of the jig 500 is removed to expose the channel 63 (block 112) and to optionally allow introduction of adhesive to the segments 48 (block 114). At block 116, segments 48 shaped for construction into the form of a ring 300 are placed into their respective staging areas in the channel 63 of the jig 500 (as also depicted in FIG. 6). At block 118, the dowels 54 are placed in contact with a respective outer surface of each segment 48. After the jig 500 is fully populated with segments 48, at block 120 the adjustment string 92 (which can be any flexible linear element with the appropriate breaking strength, such as fiber or braided fishing line) is fed through the nocks 72 of the dowels 54, tightened, and secured so each of the segments 48 is simultaneously compressed toward the opposing springs 64 and into the desired ring shape, as depicted in FIG. 7 or in detail 702. Securing of the adjustment string 92 entails passing the ends of the string 92 through a respective feed hole 76 in the threaded post(s) 74 of the tensioner peg(s) 56 affixed to the base 50 radially outward from the perimeter of the outer housing 52. As shown in FIG. 9, the adjustment string 92 is then clamped down by tightening an upper hex nut 94 on the threaded post 74 of the tensioner peg 56. Rotating the tensioner peg 56 allows for control of the tension in the adjustment string 92 and, consequently, the radial displacement of each dowel 54 towards the inner hub 62 of the jig 500. The uniformly applied tension causes each dowel 54 to encounter and displace the segments 48 to circumferentially compress the segments 48 to form ring 300. After each of the segments are put in contact with one another, the adjustment string 92 can be secured in place by tightening a lower hex nut 96 on the tensioner pegs 56 to the base 50 of the jig 500. At block 122, the top cap 58 is screwed onto the inner hub 62 to align each segment 48 vertically within the channel 63 so the proper ring height is uniformly achieved.

After the adhesive between adjacent segments 48 is allowed to cure at block 124, the tension in the adjustment string 92 is relaxed (that is, disengaged from the tensioner pegs 65) such that the dowels 54 are no longer radially displaced within the through holes 53 into channel 63 (block 126). At block 128, the top cap 58 that contains the ring 300 in the jig 500 is removed (e.g., with a screwdriver). At block 130, the dowels 54 are pulled back such that the adhered ring 300 can be removed (for example, with tweezers) from the channel 63 of the jig 500. The springs 64 remain in place (compressed/displaced) until the ring 300 is shimmied out of the channel 63 of the jig 500. An extraction ribbon 82 can be inserted in the channel 63 before placing segments 48 to aid in removal of finished ring 300. Extraction ribbon 82 can be made from non-stick polymer tape. After the finished ring 300 is removed from the channel 63 of the jig 500, the springs 64 are no longer compressed by the ring 300 and return to their original length before the process ends at block 132. All components of the jig 500 are recoverable and reusable for subsequent ring construction operations.

Certain embodiments of the jig described herein enable creation of a segmented ring of relatively small size (e.g., approximately 1-2 inches in outer diameter and 0.75-1.5 inches in inner diameter). The height of such a segmented ring is 0.15-0.3 inches and the thickness of the ring is 0.05-0.1 inches.

The contact between each of the segments 48 contributes significantly to a successful adhesive bond, which requires a proper amount of radial displacement toward the center (i.e., inner hub 62) of the fixture. To achieve the contact required for a proper adhesive bond, the compliance or, inversely, the stiffness of the springs 64 can be tailored for the desired application. The compliance of the springs 64 allows for ease of compressing the segments 48 but also maintains the shape of the ring 300.

The cap 58 used to align the segments 48 in the vertical direction is screwed on after the segments 48 are locked in the ring geometry. The cap 58 compresses the ring 300 in the vertical direction such that the proper right height is achieved. Securing the top cap 58 is an advantageous method of achieving the proper ring height, while also containing the segments 48 within the interior space (e.g., channel 63). The staging area (i.e., channel 63) in the jig 500 is large enough such that it accounts for variation in ring size. Variation in ring size can be induced by slight differences in segment geometry, tolerances, and human error in the adhesion process. The staging area within the channel 63 can be large enough to work inside by hand.

The segmented ring 300 size (radius, thickness, and length) can be larger or smaller depending on the desired performance. Therefore, the size of the jig 500 can be scaled to smaller or larger dimensions as required. The arc length of the segments 48 can be different sizes in the segmented ring design, requiring modification of the location of dowels 54 on the perimeter of the outer housing 52. The dowel 54 locations are designed to make contact in the center of the outer surface area of each segment 48. The geometry of the segments can be different (e.g., either circular arc or trapezoidal) depending on constraints associated with segment material fabrication.

The base 50, outer housing 52, and inner hub 62 are preferably machined from a single piece of aluminum. Base 50 can be made from different material (e.g., not necessarily made from aluminum). Non-stick polymer coating of the components 50, 52, and 62 is not required but is an optional feature that prevents adhesion of segments 48 in contact with the components. The number of dowels 54 can be modified depending on the number of segments 48 that are required to be adhered together during ring construction.

The compliance of the backing springs 64 can be modified depending on the level of stress required to join the segments 48 together. The method of compression can be modified such that it does not involve inducing tension into an adjustment string 92 to radially displace dowels 54 into contact with segments 48. The method of compression can optionally involve other means of radially displacing the dowels 54. For example, an elastomeric band can be provided around the dowels 54. Set screws in threaded apertures could also be used instead of dowels 54. The method of compression can involve using another means of radially displacing the segments 48 toward the center of the fixture that do not involve the use of dowels 54.

The foregoing description of the preferred embodiments of the invention has been presented for purposes of illustration and description only. It is not intended to be exhaustive nor to limit the invention to the precise form disclosed; and obviously many modifications and variations are possible in light of the above teaching. Such modifications and variations that may be apparent to a person skilled in the art are intended to be included within the scope of this invention as defined by the accompanying claims.

What is claimed is:

1. An apparatus for assembly of a segmented ring, comprising:
    a base configured to carry an inner hub and an outer housing; the outer housing having a plurality of through holes radially therethrough, wherein said inner hub and said outer housing define a ring-shaped channel therebetween and above said base;
    a plurality of springs fixedly disposed about a perimeter of said inner hub within the ring-shaped channel; and
    a plurality of dowels each received by a respective one of said through holes and each paired with a respective one of said plurality of springs within the ring-shaped channel, to define a plurality of pinch pairings.

2. The apparatus of claim 1, wherein each of said dowels has a first and second end, said first end having a nock formed therein, and each second end passed through a respective one of said through holes in said outer housing such that said nock of each of said dowels extends beyond an exterior surface of said outer housing.

3. The apparatus of claim 2, further comprising an adjustment string configured to apply uniform radial force at said nock for each of said dowels.

4. The apparatus of claim 3, further comprising a tensioner peg mounted to said base and configured to secure said adjustment string.

5. The apparatus of claim 4, wherein said tensioner peg further comprises at least one hex nut and a threaded post.

6. The apparatus of claim 1, further comprising a top cap removably mounted to said inner hub opposite said base and positioned to enclose the ring-shaped channel.

7. The apparatus of claim 6, wherein at least one of said inner hub, said outer housing, said base, and said top cap are made from aluminum coated with a non-sticking polymer.

8. A method of assembling a plurality of segments into a ring comprising the steps of:
    providing a jig comprising:
    a base having an inner hub and an outer housing, the outer housing having a plurality of through holes radially therethrough, wherein said inner hub and said outer housing define a ring-shaped channel therebetween and above said base;
    a plurality of springs fixedly disposed about a perimeter of said inner hub within the ring-shaped channel;
    a plurality of dowels;

positioning each of the plurality of segments proximate a respective one of said plurality of springs within the ring-shaped channel; and receiving an inner end of each of said dowels into a respective one of said through holes so as to pinch a respective one of the plurality of segments with a respective one of said plurality of springs, to define a plurality of pinch pairings.

9. The method in accordance with claim 8, wherein said jig further comprises an adjustment string; the method further comprising applying a uniform force to each of said dowels at a respective outer end extending beyond an exterior surface of said outer housing using said adjustment string.

10. The method in accordance with claim 9, wherein said jig further comprises a tensioner peg mounted to said base; the method further comprising securing said adjustment string to said tensioner peg.

11. The method in accordance with claim 10, wherein said tensioner peg further comprises at least one hex nut; the method further comprising tuning, using said at least one hex nut, said adjustment string to said uniform force as applied to said dowels.

12. The method in accordance with claim 8, wherein said jig further comprises a top cap; the method further comprising removably mounting said top cap to said inner hub opposite said base, and positioning said top cap to enclose the ring-shaped channel.

13. The method in accordance with claim 8, further comprising applying an adhesive between at least one adjacent pair of the plurality of segments.

14. The method in accordance with claim 13, further comprising the steps of:

allowing said adhesive to cure;

repositioning said dowels to retract radially outward from said plurality of pinch pairings; and extracting the plurality of segments from the ring-shaped channel upon curing of said adhesive to provide the ring.

15. A segmented ring assembly constructed using a method comprising the steps of:

applying an adhesive between at least one adjacent pair of a plurality of segments;

positioning each of said plurality of segments proximate a respective one of a plurality of springs fixedly disposed about a perimeter of an inner hub within a ring-shaped channel defined between said inner hub and an outer housing having a plurality of through holes radially therethrough; and receiving each of a plurality of dowels into a respective one of said plurality of through holes so as to pinch a respective one of said plurality of segments with a respective one of said plurality of springs, to define a plurality of pinch pairings.

16. The segmented ring assembly in accordance with claim 15, further comprising applying a uniform radial force, using an adjustment string, to each of said dowels at a respective outer end extending beyond an exterior surface of said outer housing.

17. The segmented ring assembly in accordance with claim 16, further comprising securing said adjustment string to a tensioner peg mounted to a base, said base configured to fixedly position said inner hub with respect to said outer housing.

18. The segmented ring assembly in accordance with claim 17, further comprising tuning, using at least one hex nut of said tensioner peg, said adjustment string to apply the uniform tension to said dowels radially inward along said plurality of through holes.

19. The segmented ring assembly in accordance with claim 15, further comprising removably mounting a top cap to said inner hub opposite said base, and positioning said top cap to enclose the ring-shaped channel.

20. The segmented ring assembly in accordance with claim 15, further comprising the steps of:

allowing said plurality of segments to cure while being held in said plurality of pinch pairings;

repositioning each of said plurality of dowels to retract radially outward from said plurality of pinch pairings; and extracting said plurality of segments from the ring-shaped channel to provide the segmented ring assembly.

* * * * *